United States Patent [19]
Rybicki et al.

[11] Patent Number: 5,410,270
[45] Date of Patent: Apr. 25, 1995

[54] DIFFERENTIAL AMPLIFIER CIRCUIT HAVING OFFSET CANCELLATION AND METHOD THEREFOR

[75] Inventors: Mathew A. Rybicki; Kelvin E. McCollough, both of Austin, Tex.

[73] Assignee: Motorola, Inc., Schaumburg, Ill.

[21] Appl. No.: 195,511

[22] Filed: Feb. 14, 1994

[51] Int. Cl.[6] .............................................. H03F 1/02
[52] U.S. Cl. ............................................ 330/9; 330/51
[58] Field of Search ........................ 330/9, 51, 69, 107, 330/109

[56] References Cited

U.S. PATENT DOCUMENTS

| | | | |
|---|---|---|---|
| 3,491,307 | 1/1970 | Solomon et al. | 330/30 |
| 3,530,395 | 9/1970 | Prusha | 330/69 |
| 3,845,404 | 10/1974 | Trilling | 330/69 |
| 4,105,942 | 8/1978 | Henry | 330/261 |
| 4,168,440 | 9/1979 | Gray | 307/233 |
| 4,574,250 | 3/1986 | Senderowicz | 330/258 |
| 4,647,865 | 3/1987 | Westwick | 330/51 |
| 4,697,152 | 9/1987 | Westwick | 330/9 |
| 5,220,286 | 6/1993 | Nadeen | 330/51 X |

OTHER PUBLICATIONS

Kuo-Chiang Hsieh, et al., "A Low Noise Chopper-Stabilized Differential Switched-Capacitor Filtering Technique," IEEE Journal of Solid-State Circuits, Dec. 1981, vol. SC–16, No. 6, pp. 708–715.
Robert W. Brodersen, et al., "MOS Switched-Capacitor Filters," Proceedings of the IEEE, Jan. 1979, vol. 67, No. 1, pp. 61–75.
Tat C. Choi, et al., "Considerations for High-Frequency Switched-Capacitor Ladder Filters," IEEE Transactions on Circuits and Systems, Jun. 1980, vol. CAS–27, pp. 545–552.
J. Terry Caves, et al., "Sampled Analog Filtering Using Switched Capacitors as Resistor Equivalents," IEEE Journal of Solid-State Circuits, Dec. 1977, vol. SC–12, No. 6, pp. 592–599.
Carl F. Kurth, et al., "Two Port Analysis of Switched-Capacitor Networks Using Four-Port Equivalent Circuits in the z-Domain," IEEE, Mar. 1979, vol. CAS–26, No. 3, pp. 166–180.
K. R. Laker, "Equivalent Circuits for the Analysis and Synthesis of Switched Capacitor Networks," The Bell System Technical Journal, Mar. 1979, vol. 58, No. 3 pp. 729–769.

*Primary Examiner*—Steven Mottola
*Attorney, Agent, or Firm*—Elizabeth A. Apperley

[57] ABSTRACT

The present invention provides a circuit (10) and method for sampling a single-ended signal and then converting the single-ended signal to a differential signal. After the single-ended signal is converted to a differential signal, then the offset voltage and low frequency noise of an operational amplifier (38) are subtracted from the differential signal using analog techniques. The subtraction operation effectively removes an operational amplifier's offset voltage and a low frequency noise from being a source of error in the differential output signal of the circuit.

19 Claims, 1 Drawing Sheet

DIFFERENTIAL AMPLIFIER CIRCUIT HAVING OFFSET CANCELLATION AND METHOD THEREFOR

FIELD OF THE INVENTION

This invention relates generally to a sample amplifier, and more particularly to a sample amplifier for use where operational amplifier error sources must be minimal.

BACKGROUND OF THE INVENTION

CMOS, single-ended to differential conversion circuits which allow a signal referenced to a ground potential to be converted to a fully balanced differential signal are currently available for use in data processing systems. Generally, by converting a single-ended signal to a differential signal, the dynamic range and quality of the signal may be more easily preserved. Furthermore, differential signals are typically less sensitive to power supply noise and are capable of achieving a dynamic range which is approximately twice that of a single-ended signal. Another advantage of implementing such CMOS single-ended to differential conversion circuits is that a signal may be sampled and held during the conversion operation.

There are few prior art circuits which convert a single-ended signal to a differential signal without introducing errors. Therefore, several causes of error must be overcome to preserve signal quality. To preserve signal quality, the circuit must have good power supply rejection to be operated on a same silicon substrate as other circuits which produce noise. Power supply rejection refers to the ability of a circuit to reject or attenuate any noise which is introduced onto the power supply. Digital circuits are examples of such noise producing circuits. Also, the circuit which preserves signal quality must be capable of compensating for a difference between a d.c. component of the single-ended signal and the common mode of the differential output signal such that no distortion components are introduced in the differential output signal. It should be noted herein that the common mode of a differential signal is the average value of the two components of the signal. Additionally, the circuit must be capable of removing offset voltages and low frequency noise from any active amplifiers which are used in a conversion process.

A prior art circuit is disclosed in U.S. Pat. No. 4,647,865 by Alan L. Westwick and assigned to Motorola, Inc. In U.S. Pat. No. 4,647,865, a single-ended signal is converted to a differential signal through the use of switches, capacitors and a operational amplifier. On one clock phase, the single-ended input signal is sampled on two series-connected capacitors. On the second clock phase, the charges on these two capacitors are transferred to a pair of integrating capacitors. The pair of integrating capacitors are connected in negative feedback around the operational amplifier. The circuit disclosed in U.S. Pat. No. 4,647,865 converts an input signal to a fully balanced differential signal with all of the attributes mentioned above. However, if the operational amplifier contains an input referred offset voltage or low frequency noise, then the offset voltage and the low frequency noise are summed with the differential signal. This addition of a constant or low frequency signal quantity to the signal being processed is undesirable in many applications.

SUMMARY OF THE INVENTION

The previously mentioned needs are fulfilled with the present invention. Accordingly, there is provided, in a first form, a single-ended to differential amplifier circuit. The single-ended to differential amplifier includes a input sampling circuit for receiving an input signal. The input sampling circuit samples the input signal and stores a first charge value corresponding to the input signal. A transfer circuit is connected to the input sampling circuit for transferring the first charge value. An operational amplifier is connected to the transfer circuit for receiving the first charge value. The operational amplifier has an offset value and an error value. An integration circuit is connected to the operational amplifier for integrating the first charge value. The integration circuit combining the first charge value, the offset value and an error value to generate an output value. A cancellation circuit is connected to the integration circuit and the operational amplifier. The cancellation circuit subtracts the offset value and the error value from the output value to produce a corrected output value.

Additionally, there is provided, in a second form, a method for operating an amplifier circuit. The method includes the steps of receiving an input signal, and sampling the input signal and storing a first charge value corresponding to the input signal. The method also includes the step of transferring the first charge value to an operational amplifier, the operational amplifier having an offset value and an error value. The method also includes the step of integrating the first charge value, the offset value and an error value to generate an output value. The method also includes the step of subtracting the offset value and the error value from the output value to produce a corrected output value.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

The present invention converts a single-ended input signal to a fully differential output signal without adding any appreciable signal errors. Additionally, the present invention provides a circuit and method for sampling, and then subtracting both the offset voltage of an operational amplifier and low frequency noise from the differential output signal. The subtraction operation effectively removes the operational amplifier's offset voltage and low frequency noise from being a source of error in the differential output signal of the circuit. While prior art circuits are capable of performing a similar conversion process, none are able to effectively remove the operational amplifier's input referred offset voltage or low frequency noise from the differential output signal.

During a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

Description of Connectivity

Figure 1:
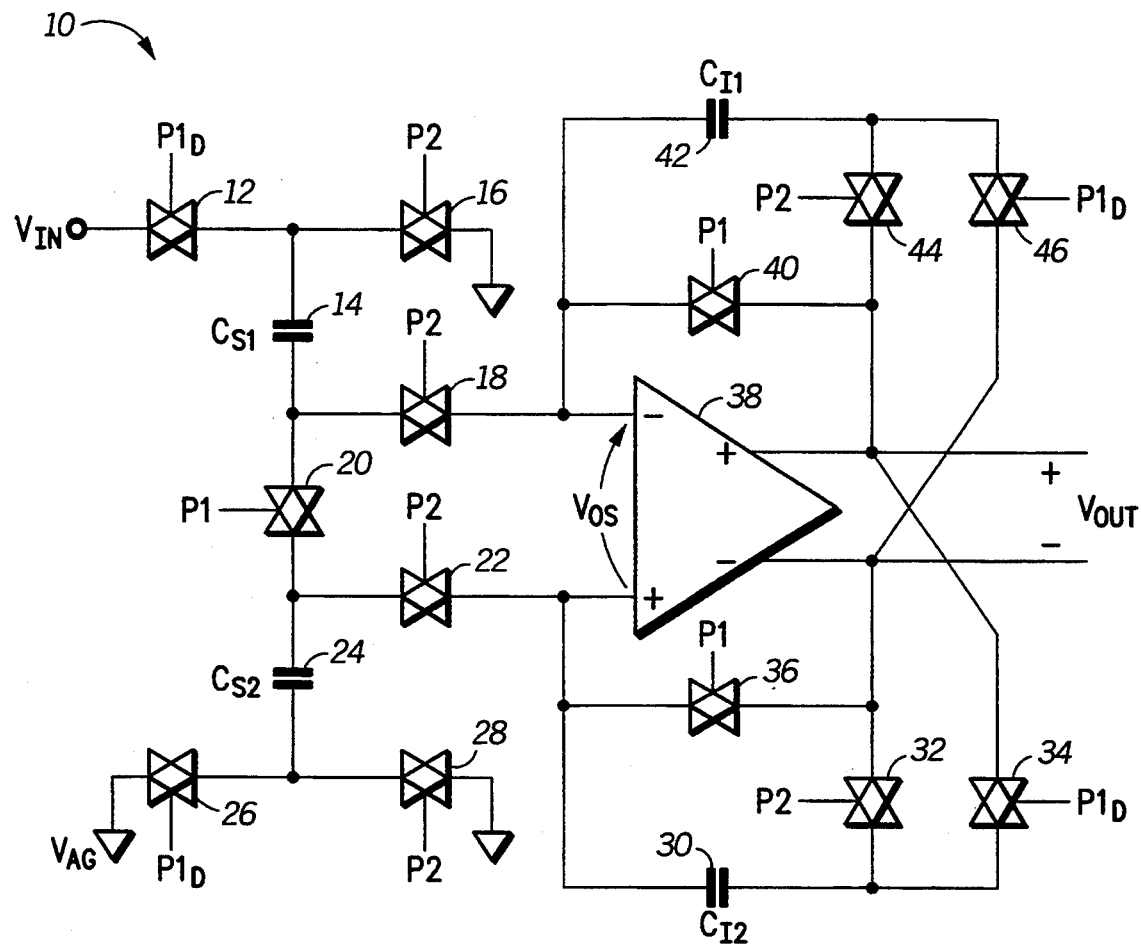
FIG. 1 illustrates in circuit diagram form a differential amplifier in accordance with the present invention.

FIG. 1 illustrates a single-ended to differential circuit with offset cancellation 10. Single ended to differential circuit with offset cancellation 10 generally includes a switch 12, an input capacitor (CS1) 14, a switch 16, a switch 18, a switch 20, a switch 22, an input capacitor (CS2) 24, a switch 26, a switch 28, a feedback capacitor 30, a switch 32, a switch 34, a switch 36, an operational amplifier 38, a switch 40, a feedback capacitor 42, a switch 44 and a switch 46.

An input signal, Vin, is provided to a first terminal of switch 12. A $P1_D$ clock signal is provided to a second terminal of switch 12. A third terminal of switch 12 is coupled to a first terminal of switch 16 and a first electrode of input capacitor (CS1) 14. A P2 clock signal is provided to a second terminal of switch 16 and a third terminal of switch 16 is coupled to a reference ground voltage. A second terminal of input capacitor 14 is coupled to a first terminal of switch 18 and a first terminal of switch 20. The P2 clock signal is provided to a second terminal of switch 18 and a P1 clock signal is coupled to a second terminal of switch 20. A third terminal of switch 20 is coupled to a first terminal of switch 22 and a first electrode of input capacitor (CS2) 24. The P2 clock signal is provided to a second terminal of switch 22. A second electrode of input capacitor 24 is coupled to a first input of switch 26 and a first input of switch 28. The $P1_D$ clock signal is provided to a second terminal of switch 26 and the P2 clock signal is provided to a second terminal of switch 28. An analog ground voltage, VAG, is provided to a third terminal of switch 26 and the reference ground voltage is provided to a third terminal of switch 28. In this embodiment of the invention, VAG and the reference ground voltage may be coupled together such that they are the same value.

A third terminal of switch 18 is coupled to a first input ("−") of operational amplifier 38, a first terminal of switch 40, and a first electrode of feedback capacitor (CI1) 42. A third terminal of switch 22 is coupled to a second input ("+") of operational amplifier, a first terminal of switch 36, and a first electrode of feedback capacitor (CI2) 30. A first output ("+") of operational amplifier 38 is coupled to a second terminal of switch 40, a first terminal of switch 44, and a first terminal of switch 34. A second output ("−") of operational amplifier 38 is coupled to a second terminal of switch 36, a first terminal of switch 32, and a first terminal of switch 46.

A third terminal of switch 40 and a third terminal of switch 36 both receive the P1 clock signal. A second terminal of switch 44 receives the P2 clock signal and a third terminal of switch 44 is coupled to a second electrode of feedback capacitor 42 and a second terminal of switch 46. A third terminal of switch 46 receives the $P1_D$ clock signal. A second terminal of switch 32 receives the P2 clock signal and a third terminal of switch 32 is coupled to a second electrode of feedback capacitor 30 and a second terminal of switch 34. A third terminal of switch 34 receives the $P1_D$ clock signal.

Operation of the embodiment of the present invention illustrated in FIG. 1 will subsequently be discussed in more detail.

Description of Operation

As was previously stated, the present invention converts a single-ended input signal to a fully differential output signal without adding any appreciable signal errors. The present invention is generally used to process an analog input signal of a CMOS integrated circuit (not shown herein). Single-ended to differential circuit with offset cancellation 10 receives a single-ended analog signal which is referenced to an analog ground voltage, VAG, and converts that single-ended analog signal to a balanced differential output signal. Subsequently, the CMOS integrated circuit generally processes the input signal in a differential format. Therefore, single-ended to differential circuit with offset cancellation 10 may be used when an input signal is received in a single-ended format and it is advantageous to process that input signal in a differential format. A typical advantage of processing the input signal in a differential format is that the differential signal is immune to substrate noise which would otherwise be coupled to a signal in the single-ended format. A differential signal is also capable of twice a dynamic range of a single-ended signal from a same supply voltage.

Numerous integrated circuit applications exist for the circuit and method disclosed in the present inventions. Such integrated circuit applications include telecommunications, analog-to-digital converters, mixed signal processors and general communications devices.

Before beginning a more detailed description of FIG. 1 and FIG. 2, the labeling conventions used in each of FIG. 1 will be explained in more detail. In the preferred embodiment of the invention, Vin is an analog voltage value whose range falls within and includes the external power supplies. The reference ground voltage is nominally equal to a mid-supply voltage value. In this description of the invention, the VAG is equal to the reference ground voltage. It should be understood, however, that VAG is not always required to be equal to the reference ground voltage.

In addition to describing the labeling conventions, a general description of the timing used in the differential amplifier circuit of FIG. 1 will be described. The timing diagram is illustrated in FIG. 2. In FIG. 2, three clock signals, P1, $P1_D$, and P2 are illustrated. $P1_D$ is a delayed version of the P1 clock signal. Additionally, in this embodiment of the invention, the P2 clock signal is only asserted when the P1 and the $P1_D$ clock signals are negated.

During operation of the differential amplifier illustrated in FIG. 1, a value to be sampled is provided via the $V_{in}$ signal. Single ended to differential circuit with offset cancellation 10 converts the single-ended signal at Vin which is referenced to analog ground potential, $V_{AG}$, to a differential signal, Vout. A unique feature of single ended to differential circuit with offset cancellation 10 is that an input offset voltage and a low frequency noise value inherent in operational amplifier 38 is canceled in the Vout signal.

During a subsequent description of operation of single ended to differential circuit with offset cancellation 10, assume that, if an input signal applied to Vin is equal to $V_{AG}$, then an offset voltage and a low frequency noise from operational amplifier 38 will appear at the differential output, Vout. Also, assume that the low frequency noise includes frequencies sufficiently below a clock rate of any clocks (circuitry not shown herein) used herein. Furthermore, assume that if the offset voltage of operational amplifier 38 may be canceled from the Vout signal, any low frequency noise which appears as an input to operational amplifier 38 will also be canceled.

During operation of the present embodiment of the invention, one full clock cycle (of the P1 clock signal) is necessary to sample, hold, and then cancel the offset voltage of operational amplifier 38. To demonstrate the steps of sampling, holding, and canceling the offset voltage, assume that the input voltage, Vin, is forced to a value of zero volts with respect to VAG. Next, allow the P1 and P1$_D$ clock signals to both be asserted as shown in the clock timing diagram in FIG. 2. The two input capacitors (CS1) 14 and (CS2) 24 charge to a value of zero volts through each of switches 12, 20 and 26. Concurrently, operational amplifier 38 holds the output voltage, Vout, equal to an input referred offset voltage, Vos, via switches 40 and 36. Additionally, during this time, feedback capacitors (CI1) 42 and (CI2) 30 respectively charge to the input referred offset voltage, Vos, and minus the input referred offset voltage, −Vos, of operational amplifier 38, via switches 46 and 34.

When the P1 clock signal is negated, the Vin input voltage is sampled onto input capacitor (CS1) 14 and input capacitor (CS2) 24. Furthermore, the offset voltage, Vos, is sampled onto feedback capacitor (CI1) 42 and feedback capacitor (CI2) 30. When the P1$_D$ clock signal transitions to a low logic state, all switches connected to P1$_D$ turn off and await the assertion of the P2 clock signal.

Figure 2:
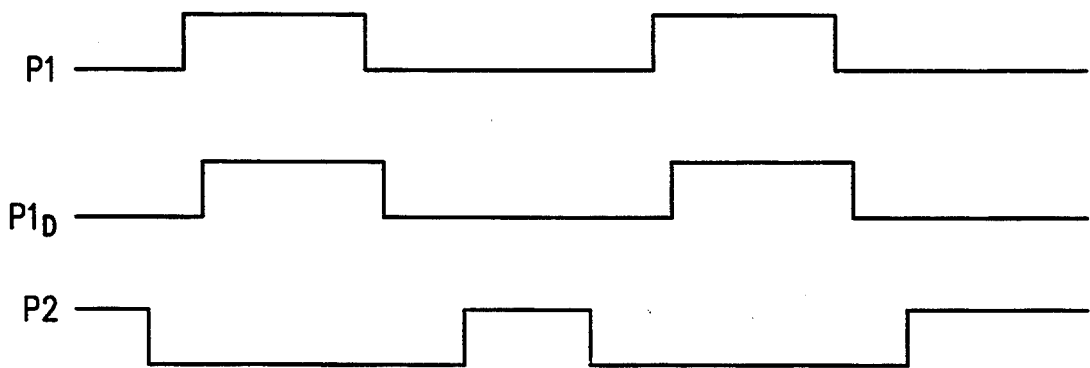
FIG. 2 provides a timing diagram illustrating the timing phases of the differential amplifier of FIG. 1.

As shown in FIG. 2, the P2 clock signal is then asserted. When the P2 clock signal is asserted, input capacitor (CS1) 14 and input capacitor (CS2) 24 are each coupled to the reference ground voltage via switches 16 and 28. Input capacitor (CS1) 14 and input capacitor (CS2) 24 are also coupled to the inputs of operational amplifier 38 via switches 18 and 22. Feedback capacitor (CI1) 42 and feedback capacitor (CI2) 30 are then coupled to outputs of operational amplifier 38 via switches 44 and 32. When in this configuration, feedback capacitor (CI1) 42 and feedback capacitor (CI2) 30 are coupled to outputs which are opposite from those to which they were connected while the P1 clock signal was asserted.

Since Vin is initially zero volts with respect to VAG, input capacitor (CS1) 14 and input capacitor (CS2) 24 have a zero charge. While the P2 clock signal is asserted, both input capacitor (CS1) 14 and input capacitor (CS2) 24 are forced to charge up to Vos/2 and minus Vos/2, respectively. This forced charge is a result of the connection of input capacitor (CS1) 14 and input capacitor (CS2) 24 to the input terminals of operational amplifier 38. If the input (14 and 24) and feedback (42 and 30) capacitors are equal in capacitance value, then an additional charge required to charge input capacitor (CS1) 14 to Vos/2 and to charge input capacitor (CS2) 24 to minus Vos/2 is provided by feedback capacitor (CI1) 42 and feedback capacitor (CI2) 30, respectively.

Once input capacitor (CS1) 14 and input capacitor (CS2) 24 are charged to Vos/2 and minus Vos/2, respectively, the charges stored on feedback capacitor (CI1) 42 and feedback capacitor (CI2) 30 are reduced by the same respective quantities. Therefore, feedback capacitor (CI1) 42 has a value of minus Vos/2 and feedback capacitor (CI2) 30 has a value of Vos/2 stored thereon. The Vos voltage differential present between the input terminals of operational amplifier 38 is then canceled by the voltage values stored on each of feedback capacitor (CI1) 42 and feedback capacitor (CI2) 30 such that the differential output, Vout, of operational amplifier 38 is equal to zero volts. This is the desired result.

Through superposition, a Vin signal which is not equal to zero volts may be used and the same offset cancellation will result. Input referred operational amplifier noise which is sufficiently lower in frequency than the P1 clock signal (such as 1/f noise, where f is equal to the frequency of the noise), will be canceled in the same manner that the offset voltage of operational amplifier 38 is canceled. Other sources of sampling error may still exist in this circuit but such sources should not be any worse than error sources which exist in prior art circuits.

The configuration of switches 46 and 34 allows single-ended to differential circuit with offset cancellation 10 to provide the offset cancellation benefits disclosed herein. However, the configuration of switches 46 and 34 may be modified such that they are connected to the inputs of operational amplifier 38, rather than the outputs. In this second configuration, offset cancellation is also achieved. The offset cancellation occurs because switches 40 and 36 ensure that each input of operational amplifier 38, and its complemented output, are at a same voltage potential. This configuration, however, will generate additional errors due to a charge injection of switches 46 and 34 into a virtual ground of operational amplifier 38.

If a differential input signal were presented at Vin and if the third terminal of switch 26 were connected to a second half of this differential signal, then offset cancellation could still be achieved even though a conversion from a single-ended signal to a differential signal would be lost.

In the present embodiment of the invention as illustrated in FIG. 1, capacitor ratios are important for proper operation of circuit 10. Typically, the capacitor ratios are equal to unity. However, the capacitor ratios may be chosen to create additional benefits. For example, if input capacitors 14 and 24 are larger or smaller in value than feedback capacitors 42 and 30, the offset voltage will be over or under compensated, respectively. Therefore, where a capacitor inequality cannot be avoided, additional switches and capacitors may then be added. Through the use of such additional switches and capacitors, a method of sampling the offset voltage of operational amplifier 38 onto one or more capacitors and then transferring a sampled charge onto another one or more capacitors to effectively cancel the offset voltage of operational amplifier 38 may be achieved.

It should be noted that a digital circuit which generates the P1, P1$_D$, and P2 clock signals illustrated in FIG. 2, would typically be integrated on a same silicon substrate as circuit 10. Such a clock generation circuit would generally be proximate to circuit 10 to minimize clock delays. However, if an application required, the clock signals could be generated on another integrated circuit, or even by an external signal generator, and then provided to circuit 10. Each of the P1, P1$_D$, and P2 clock signals may be implemented with standard logic circuitry.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A single-ended to differential amplifier circuit, comprising:

input sampling means for receiving an input signal, the input sampling means sampling the input signal and storing a first charge value corresponding to the input signal;

transfer means coupled to the input sampling means for transferring the first charge value;

an operational amplifier coupled to the transfer means for receiving the first charge value, the operational amplifier having an offset value and an error value;

an integration means coupled to the operational amplifier for integrating the first charge value, the integration means combining the first charge value, the offset value and the error value to generate an output value; and a cancellation means coupled to the integration means and the operational amplifier, the cancellation means subtracting the offset value and the error value from the output value to produce a corrected output value, the cancellation means comprising:

a first switch for transferring a first portion of the offset voltage and the error value from the integration means to a first output of the operational amplifier, the first switch having a first terminal coupled to the second terminal of the first feedback capacitor, a second terminal for receiving the delayed first clock signal, and a third terminal coupled to the second output of the operational amplifier; and a second switch for transferring a second portion of the offset voltage and the error value from the integration means to a second output of the operational amplifier, the second switch having a first terminal coupled to the second terminal of the second feedback capacitor, a second terminal for receiving the delayed first clock signal, and a third terminal coupled to the first output of the operational amplifier;

the first portion of the offset voltage and the error value and the second portion of the offset voltage and the error value being used to generate the corrected output value.

2. The single-ended to differential amplifier circuit of claim 1 wherein the error value is equal to a low frequency noise value.

3. The single-ended to differential amplifier circuit of claim 1 wherein the input sampling means comprises:

a third switch having a first terminal for receiving the input signal, a second terminal for receiving a delayed first clock signal, and a third terminal for transferring the input signal in response to the delayed first clock signal;

a first input capacitor having a first electrode coupled to the third terminal of the third switch and a second electrode, the first input capacitor storing the first charge value corresponding to a first portion of the input signal;

a fourth switch having a first terminal coupled to the second electrode of the first input capacitor, a second terminal for receiving a first clock signal, and a third terminal;

a second input capacitor having a first electrode coupled to the third terminal of the fourth switch and a second electrode, the second input capacitor storing a second charge value corresponding to a second proportion of the input signal; and a fifth switch having a first terminal for receiving the analog reference ground voltage, a second terminal for receiving the delayed first clock signal, and a third terminal coupled to the second electrode of the second input capacitor for transferring an analog ground voltage.

4. The single-ended to differential amplifier circuit of claim 3 wherein the input signal is a differential signal and the analog ground voltage is a portion of the differential signal.

5. The single-ended to differential amplifier circuit of claim 3 wherein the transfer means further comprises:

a sixth switch having a first terminal coupled to the third terminal of the third switch, a second terminal coupled to a second clock signal, and a third terminal coupled to a reference ground voltage;

a seventh switch having a first terminal coupled to the second electrode of the first input capacitor, a second terminal for receiving the second clock signal, and a third terminal coupled to a first input of the operational amplifier;

an eighth switch having a first terminal coupled to the third terminal of the fourth switch, a second terminal for receiving the second clock signal, and a third terminal coupled to a second input of the operational amplifier; and a ninth switch having a first terminal coupled to the third terminal of the fifth switch, a second terminal for receiving the second clock signal, and a third terminal for receiving the reference ground voltage.

6. The single-ended to differential amplifier of claim 5 wherein the integration means comprises:

a tenth switch having a first terminal coupled to the first input of the operational amplifier, a second terminal for receiving the first clock signal, and a third terminal coupled to a first output of the operational amplifier;

a first feedback capacitor having a first terminal coupled to the first input of the operational amplifier and a second terminal;

an eleventh switch having a first terminal coupled to the first output of the operational amplifier, a second terminal for receiving the second clock signal, and a third terminal coupled to the second terminal of the first feedback capacitor;

a twelfth switch having a first input coupled to the second input of the operational amplifier, a second terminal for receiving the first clock signal, and a third terminal coupled to a second output of the operational amplifier;

a second feedback capacitor having a first terminal coupled to the second input of the operational amplifier and a second terminal; and a thirteenth switch having a first terminal coupled to the second output of the operational amplifier, a second terminal for receiving the second clock signal, and a third terminal coupled to the second terminal of the second feedback capacitor.

7. The single-ended to differential amplifier circuit of claim 1 wherein the input signal is referenced to the analog reference ground voltage.

8. A method for operating an amplifier circuit comprising the steps of:
 receiving an input signal;
 sampling the input signal and storing a first charge value corresponding to the input signal;
 transferring the first charge value to an operational amplifier, the operational amplifier having an offset value and an error value;
 integrating the first charge value using an integration circuit, the offset value and an error value to generate an output value;
 transferring a first portion of the offset voltage and the error value from the integration circuit to a first output of the operational amplifier using a first switch; and
 transferring a second portion of the offset voltage and the error value from the integration circuit to a second output of the operational amplifier using a second switch;
 the first portion of the offset voltage and the error value and the second portion of the offset voltage and the error value being subtracted from the output value to generate a corrected output value.

9. The method of claim 8 wherein the input signal is referenced to the analog reference ground voltage.

10. The method of claim 8 wherein the error value is equal to a low frequency noise value.

11. The method of claim 8 wherein the input signal is a differential signal and the analog ground voltage is a portion of the differential signal.

12. A single-ended to differential amplifier circuit, comprising:
 a first switch having a first terminal for receiving an input signal, a second terminal for receiving a delayed first clock signal, and a third terminal;
 a first input capacitor having a first electrode coupled to the third terminal of the first switch and a second electrode;
 a second switch having a first terminal coupled to the second electrode of the first input capacitor, a second terminal for receiving a first clock signal, and a third terminal;
 a second input capacitor having a first electrode coupled to the third terminal of the second switch and a second electrode;
 a third switch having a first terminal for receiving an analog ground voltage, a second terminal for receiving the delayed first clock signal, and a third terminal coupled to the second electrode of the second input capacitor;
 a fourth switch having a first terminal coupled to the third terminal of the first switch, a second terminal coupled to a second clock signal, and a third terminal coupled to a reference ground voltage;
 a fifth switch having a first terminal coupled to the second electrode of the first input capacitor, a second terminal for receiving the second clock signal, and a third terminal coupled to a first input of an operational amplifier;
 a sixth switch having a first terminal coupled to the third terminal of the second switch, a second terminal for receiving the second clock signal, and a third terminal coupled to a second input of the operational amplifier;
 a seventh switch having a first terminal coupled to the third terminal of the third switch, a second terminal for receiving the second clock signal, and a third terminal for receiving the reference ground voltage;
 an eighth switch having a first terminal coupled to the first input of the operational amplifier, a second terminal for receiving the first clock signal, and a third terminal coupled to a first output of the operational amplifier;
 a first feedback capacitor having a first terminal coupled to the first input of the operational amplifier and a second terminal;
 a ninth switch having a first terminal coupled to the first output of the operational amplifier, a second terminal for receiving the second clock signal, and a third terminal coupled to the second terminal of the first feedback capacitor;
 a tenth switch having a first input coupled to the second input of the operational amplifier, a second terminal for receiving the first clock signal, and a third terminal coupled to a second output of the operational amplifier;
 a second feedback capacitor having a first terminal coupled to the second input of the operational amplifier and a second terminal;
 an eleventh switch having a first terminal coupled to the second output of the operational amplifier, a second terminal for receiving the second clock signal, and a third terminal coupled to the second terminal of the second feedback capacitor;
 a twelfth switch having a first terminal coupled to the second terminal of the first feedback capacitor, a second terminal for receiving the delayed first clock signal, and a third terminal coupled to the second output of the operational amplifier; and
 a thirteenth switch having a first terminal coupled to the second terminal of the second feedback capacitor, a second terminal for receiving the delayed first clock signal, and a third terminal coupled to the first output of the operational amplifier.

13. The single-ended to differential amplifier circuit of claim 12 wherein the input signal is a differential signal and the analog ground voltage is a portion of the differential signal.

14. The single-ended to differential amplifier circuit of claim 12 wherein the input signal is referenced to the analog reference ground voltage.

15. A single-ended to differential amplifier circuit, comprising:
 input sampling means for receiving an input signal, the input sampling means sampling the input signal and storing a first charge value corresponding to the input signal, wherein the input sampling means comprises:
 a first switch having a first terminal for receiving the input signal, a second terminal for receiving a delayed first clock signal, and a third terminal for transferring the input signal in response to the delayed first clock signal;
 a first input capacitor having a first electrode coupled to the third terminal of the first switch and a second electrode, the first input capacitor storing the first charge value corresponding to a first portion of the input signal;

a second switch having a first terminal coupled to the second electrode of the first input capacitor, a second terminal for receiving a first clock signal, and a third terminal;

a second input capacitor having a first electrode coupled to the third terminal of the second switch and a second electrode, the second input capacitor storing a second charge value corresponding to a second proportion of the input signal; and a third switch having a first terminal for receiving an analog reference ground voltage, a second terminal for receiving the delayed first clock signal, and a third terminal coupled to the second electrode of the second input capacitor for transferring an analog ground voltage;

transfer means coupled to the input sampling means for transferring the first charge value;

an operational amplifier coupled to the transfer means for receiving the first charge value, the operational amplifier having an offset value and an error value;

an integration means coupled to the operational amplifier for integrating the first charge value, the integration means combining the first charge value, the offset value and the error value to generate an output value; and a cancellation means coupled to the integration means and the operational amplifier, the cancellation means subtracting the offset value and the error value from the output value to produce a corrected output value.

16. The single-ended to differential amplifier circuit of claim 15 wherein the input signal is a differential signal and the analog ground voltage is a portion of the differential signal.

17. The single-ended to differential amplifier circuit of claim 15 wherein the transfer means further comprises:

a fourth switch having a first terminal coupled to the third terminal of the first switch, a second terminal coupled to a second clock signal, and a third terminal coupled to a reference ground voltage;

a fifth switch having a first terminal coupled to the second electrode of the first input capacitor, a second terminal for receiving the second clock signal, and a third terminal coupled to a first input of the operational amplifier;

a sixth switch having a first terminal coupled to the third terminal of the second switch, a second terminal for receiving the second clock signal, and a third terminal coupled to a second input of the operational amplifier; and a seventh switch having a first terminal coupled to the third terminal of the third switch, a second terminal for receiving the second clock signal, and a third terminal for receiving the reference ground voltage.

18. The single-ended to differential amplifier of claim 17 wherein the integration means comprises:

an eighth switch having a first terminal coupled to the first input of the operational amplifier, a second terminal for receiving the first clock signal, and a third terminal coupled to a first output of the operational amplifier;

a first feedback capacitor having a first terminal coupled to the first input of the operational amplifier and a second terminal;

a ninth switch having a first terminal coupled to the first output of the operational amplifier, a second terminal for receiving the second clock signal, and a third terminal coupled to the second terminal of the first feedback capacitor;

a tenth switch having a first input coupled to the second input of the operational amplifier, a second terminal for receiving the first clock signal, and a third terminal coupled to a second output of the operational amplifier;

a second feedback capacitor having a first terminal coupled to the second input of the operational amplifier and a second terminal; and an eleventh switch having a first terminal coupled to the second output of the operational amplifier, a second terminal for receiving the second clock signal, and a third terminal coupled to the second terminal of the second feedback capacitor.

19. The single-ended to differential amplifier circuit of claim 18 wherein the cancellation means comprises:

a twelfth switch having a first terminal coupled to the second terminal of the first feedback capacitor, a second terminal for receiving the delayed first clock signal, and a third terminal coupled to the second output of the operational amplifier; and a thirteenth switch having a first terminal coupled to the second terminal of the second feedback capacitor, a second terminal for receiving the delayed first clock signal, and a third terminal coupled to the first output of the operational amplifier.

* * * * *